US009893443B2

(12) United States Patent
Wittig et al.

(10) Patent No.: US 9,893,443 B2
(45) Date of Patent: Feb. 13, 2018

(54) SWITCH ELEMENT HAVING A HOUSING PART WITH SWITCH ELEMENT CIRCUIT AND AN ADAPTER PART WITH A PLURALITY OF PLUG CONTACTS FASTENED THEREIN

(71) Applicant: WÜRTH ELEKTRONIK ICS GMBH & CO. KG, Niedernhall (DE)

(72) Inventors: Klaus Wittig, Öhringen/Kappel (DE); Werner Kallee, Bad Friedrichshall (DE)

(73) Assignee: Wurth Elektronik ICS GmbH & Co. KG, Niedernhall (DE)

( * ) Notice: Subject to any disclaimer, the term of this patent is extended or adjusted under 35 U.S.C. 154(b) by 0 days.

(21) Appl. No.: 15/028,125

(22) PCT Filed: Oct. 8, 2014

(86) PCT No.: PCT/DE2014/000495
§ 371 (c)(1),
(2) Date: Apr. 8, 2016

(87) PCT Pub. No.: WO2015/051778
PCT Pub. Date: Apr. 16, 2015

(65) Prior Publication Data

US 2016/0248182 A1 Aug. 25, 2016

(30) Foreign Application Priority Data

Oct. 10, 2013 (DE) ........................ 10 2013 220 462

(51) Int. Cl.
*H01R 13/627* (2006.01)
*H01R 12/70* (2011.01)
(Continued)

(52) U.S. Cl.
CPC ......... *H01R 12/7064* (2013.01); *H01R 12/58* (2013.01); *H01R 13/627* (2013.01); *H01R 13/633* (2013.01); *H01R 2201/26* (2013.01)

(58) Field of Classification Search
USPC ................................ 439/78, 352–358, 733.1
See application file for complete search history.

(56) References Cited

U.S. PATENT DOCUMENTS 6,832,933 B2 * 12/2004 Bu ....................... H01R 12/721 439/637
7,344,391 B2 3/2008 Minich
(Continued)

FOREIGN PATENT DOCUMENTS

CN 2922187 Y 7/2007
CN 101232141 A 7/2008
(Continued)

OTHER PUBLICATIONS

International Search Report of Corresponding PCT/DE2014/000495, dated Jun. 16, 2015, 12 pages.
(Continued)

*Primary Examiner* — Chandrika Prasad
(74) *Attorney, Agent, or Firm* — Lewis Roca Rothgerber Christie LLP

(57) ABSTRACT

A switch element is provided for directly inserting into a circuit board, wherein the switch element comprises a switch element circuit and a plurality of plug contacts, wherein the plug contacts comprise a connection portion, which is connected to the switch element circuit, and a fastening portion, wherein the fastening portion is adapted such that it is directly insertable into the circuit board, and wherein the fastening portion comprises a safety element which is adapted such that an unintentionally detaching of the plug connection is prevented.

12 Claims, 2 Drawing Sheets

Figure 1:
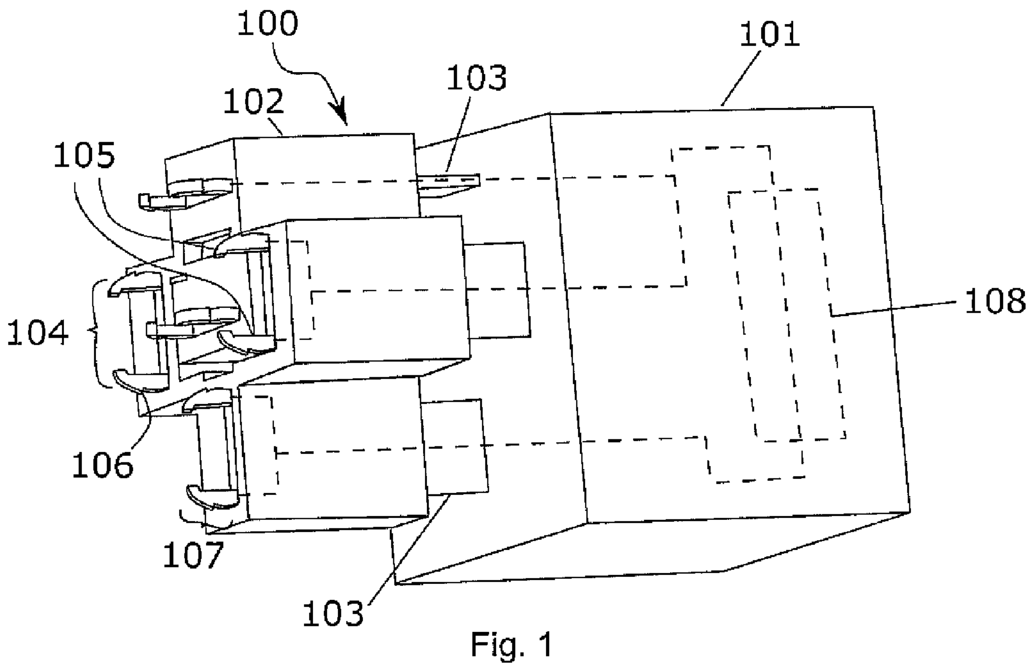

(51) Int. Cl.
*H01R 12/58* (2011.01)
*H01R 13/633* (2006.01)

(56) References Cited

U.S. PATENT DOCUMENTS

| | | | | |
|---|---|---|---|---|
| 8,075,322 | B2 | 12/2011 | Schwettmann et al. | |
| 8,403,684 | B2 * | 3/2013 | Tateishi | H01R 9/091 439/83 |
| 2001/0041467 | A1 | 11/2001 | Kikuchi et al. | |
| 2005/0136710 | A1 * | 6/2005 | Adell | H01R 12/58 439/81 |
| 2008/0176433 | A1 | 7/2008 | Sun | |
| 2008/0220665 | A1 * | 9/2008 | Darr | H01H 1/5805 439/842 |
| 2008/0291653 | A1 | 11/2008 | Sailor et al. | |
| 2012/0108083 | A1 | 5/2012 | Wittig et al. | |
| 2012/0231677 | A1 | 9/2012 | Kallee | |
| 2014/0045390 | A1 | 2/2014 | Wittig et al. | |
| 2016/0049275 | A1 * | 2/2016 | Stozinger | H01H 37/761 337/186 |
| 2016/0143138 | A1 * | 5/2016 | Goto | H05K 1/11 174/261 |

FOREIGN PATENT DOCUMENTS

| | | | |
|---|---|---|---|
| CN | 102239601 | A | 11/2011 |
| CN | 202159834 | U | 3/2012 |
| CN | 102549844 | A | 7/2012 |
| DE | 26 18 317 | A1 | 11/1977 |
| DE | 296 23 069 | U1 | 11/1997 |
| DE | 10 2008 033 205 | A1 | 1/2010 |
| DE | 10 2011 005 073 | A1 | 9/2012 |
| EP | 2 246 939 | A1 | 11/2010 |
| TW | I332291 | | 1/2008 |
| WO | WO 2010/063459 | A1 | 6/2010 |
| WO | WO 2011/033128 | A1 | 3/2011 |

OTHER PUBLICATIONS

Chinese Office action issued in parallel application 201480055340.2, dated Apr. 19, 2017, 10 pages.

* cited by examiner

SWITCH ELEMENT HAVING A HOUSING PART WITH SWITCH ELEMENT CIRCUIT AND AN ADAPTER PART WITH A PLURALITY OF PLUG CONTACTS FASTENED THEREIN

CROSS-REFERENCE TO RELATED APPLICATIONS

This application is a National Phase Patent Application of International Patent Application Number PCT/DE2014/000495, filed on Oct. 8, 2014, which claims priority to and the benefit of German Patent Application No. 10 2013 220.462.0, filed 10 Oct. 2013, the disclosures of all of which are incorporated herein by reference.

TECHNICAL FIELD

Embodiments of the present invention relate to a direct plug switch element for plug connecting with a circuit board, in particular a printed circuit board. The present invention further relates to a connection arrangement with a direct plug switch element and a circuit board. Furthermore, the present invention relates to a method for electrically connecting a switch element with a circuit board.

TECHNOLOGICAL BACKGROUND

An arrangement for electrically and mechanically connecting of plug elements via a base to a circuit board is known, which is construed for high electrical and mechanical requirements. From WO 2010/063 459 of the same applicant, also connection arrangements for circuit boards are known which enable a directly plugging of a plug part onto a circuit board without a socket being fastened to the circuit board.

EP 2 246 939 discloses an electrical connection element consisting of an electrical contact, a housing and a clamping pin. The electrical contact comprises a contact portion and a terminal portion. A contacting on the circuit board is performed by inserting the contact portion into a breakthrough in the circuit board, wherein at least the inner surface of the breakthrough is provided with an electrical contact surface. The electrical contact of the connection element is formed in the contact portion as a slit sleeve-like part with a bellied shape. This sleeve-like contact portion is elastically tapering in its diameter in an axial direction when inserting into a breakthrough and returns approximately to its original shape when having a correct fit. In this state, the clamping pin is inserted into the contact portion, thereby clamping the contact portion to the inner surface of the breakthrough. Thus, a substantially entire surface electrical contact between the sleeve and the contacted breakthrough of the circuit board is formed.

SUMMARY OF THE INVENTION

There may be a need to achieve a connection of a circuit board with a switch element which is formable with a justifiable effort and which is reliably electrically contactable also under mechanical load.

According to embodiments of the invention, a switch element, an adapter part, a connection arrangement and a method according to the independent claims are provided. Further embodiments are described in the dependent claims.

According to an exemplary aspect, a switch element for directly inserting into a circuit board (direct plug switch element) is provided, wherein the switch element comprises a switch element circuit and a plurality of plug contacts, wherein the plug contacts comprise a connection portion, which is connected to the switch element circuit, and a fastening portion, wherein the fastening portion is adapted such that it is directly insertable into the circuit board, and wherein the fastening portion comprises a securing element which is adapted such that an unintentionally detaching of the plug connection is prevented.

In particular, the plug contacts may be formed for electrically contacting the switch element circuit with the circuit board. Alternatively, the plug contacts may be formed for establishing a purely mechanical and/or an electrical connection. For example, a sub-amount of the plurality of plug contacts may be formed for establishing an electrical contacting, whereas a second sub-amount of the plurality of plug contacts is formed to perform a purely mechanical securing. In particular, the plug contacts may be formed as two parts, for example with two shanks. The shanks may be separated from each other and may comprise a certain elasticity or spring tension, such that they return to their initial position after inserting into plug holes of the circuit board, such that they support and clamp, respectively, against the lateral walls of the drilled plug holes or breakthroughs in the circuit board. For example, the switch element may be a switch element which is used in the automotive field. In particular, the switch element circuit may be a circuit which can switch a high current, i.e. may form a high current switch element. For example, the switch element circuit may be construed for a current of at least 10 A, in particular for a current of at least 20 A, preferably for a current between 30 A and 100 A. The switch element circuit may further be construed for a voltage of 12 V, 24 V, 110 V or 230 V.

According to an exemplary aspect, an adapter part for a housed switch element is provided, wherein the adapter part comprises a corpus with two surfaces, a plurality of plug contacts and a plurality of fastening holes which are adapted for contacting contacting plugs of the housed switch element, wherein the plurality of plug contacts is formed at one of the two surfaces and wherein the plurality of fastening holes is formed at the second of the two surfaces.

In particular, the plurality of plug contacts may be adapted for being inserted into corresponding plug holes of a circuit board.

According to an exemplary aspect, a connection arrangement is provided which comprises a switch element according to an exemplary aspect and a circuit board with a plurality of plug holes, wherein the switch element with the plurality of plug contacts is inserted into the plurality of plug holes.

According to an exemplary aspect, a method for directly inserting a housed switch element into a circuit board is provided, wherein the method comprises: providing a circuit board with a plurality of plug holes; directly inserting a housed switch element which comprises a plurality of plug contacts into the circuit board, wherein each of the plurality of plug contacts is inserted into a corresponding plug hole.

The term "switch element" may denote in particular all elements which serve for a switching of an electrical current, such as a relay, a fuse, a power switch or a power transistor.

The term "directly insertable" may in particular mean that the switch element and the plug contacts, respectively, are insertable into a circuit board without an additional connection and/or connection elements, in particular in boreholes or plug holes of the circuit board. In particular, therefore no solderings or welding processes may be necessary and the switch element may be fastened to a circuit board and being contacted with it, respectively, without additional connections, such as electrically conductive cables or conduits.

Therefore, in particular a directly insertable switch element or direct plug switch element may be provided, which can be inserted into a circuit board by hand. Thus, no soldering or welding may be necessary to fasten the switch element to the circuit board, for example a printed circuit board (PCB). By providing a directly insertable switch element, it may also be possible that cable connections can be omitted when the switch element is fastened to and/or contacted to the circuit board. It may also be possible to design the insertion of the plug elements on the circuit board more flexible by providing the directly insertable switch element. For example, it may be possible that a lower number of plug locations on the circuit board has to be provided as when fix connections, i.e. solderings, pressfit-connections or welding connections are provided.

In the following, embodiments of the switch element are described, but these also apply for the adapter part and the connection arrangement.

According to an exemplary embodiment of the switch element, the plug contacts are adapted such that they are insertable into the circuit board by hand.

The term “insertable by hand” may in particular denote that a necessary force effort for inserting is below a pre-given threshold value and/or that the inserting can be carried out without an additional tool. For example, the threshold value for the force effort may be below 250 N, in particular below 150 N, and preferably below 100 N. The specified forces are to be understood as entire force, i.e. they characterize the entire force which is necessary to insert the switch element into the circuit board and thus do not relate to the forces which are necessary for the single plug contacts. A connection insertable by hand may in particular be distinguishable from a pressfit connection which regularly is not achievable without a tool.

According to an exemplary embodiment of the switch element, the insertion of the fastening portion of the plug contacts is robust against vibration.

In particular, a force effort for detaching the plug connection between the fastening portion and a circuit board may be larger than a pre-given threshold value for the force effort for detaching. For example, the threshold value may be higher than 100 N, in particular higher than 200 N, and preferably higher than 300 N. The term “robust against vibration” or “mechanical securing robust against vibration” may in particular have the meaning that even when vibrations are present or occur, which act onto a technical system comprising the connection arrangement, an unintentionally detaching of the plug element from the circuit board is avoided. In particular vibrations as they occur at an engine driven, in particular combustion engine driven device (in particular a vehicle) at a mechanical securing which is designed robust against vibration, do not lead to a negative influence on the system function. In particular, when an installation of the connection arrangement is in the engine compartment of an off-road vehicle, the vibrations which typically occur there, shall not lead to an undesired loss of the electrical contact between the plug contacts and the counter contact in the respectively assigned borehole (plug opening) of the circuit board. Therefore, for achieving the robustness against vibration, the mechanical securing with respect to a material, dimensions, fastening forces etc. may be construed such that the respective vibrations do not lead to an undesired detaching of the direct plug switch element from the circuit board. For realizing the robustness against vibration, the connection arrangement may be designed in compliance with the industrial standard ISO TS 16750, in particular ISO TS 16750-3. ISO 16750 defines a standard for mechanical load requirements for off-road vehicles. For achieving the robustness against vibration, the connection arrangement may be further construed to fulfil the standard IEC 60512-4, in particular to fulfil at least one of the sub-requirements according to IEC 68.2.6 (vibration sinusoidal), IEC 68-2-27 and IEC 68-2-29 (multiple shocking), IEC 68-2-64 (broad band noise), IEC-68-2-64 (vibration in cold atmosphere) and IEC-68-2-50 and IEC-68-2-51 (vibration in warm atmosphere).

According to an exemplary embodiment of the switch element, the securing element is a mechanical securing element.

In particular, the mechanical securing feature may be formed hook-shaped or screw-like. For example, the securing feature may be formed as barb which engages behind the circuit board after inserting into the circuit board. Thus, a connection may be provided which is stable and on the one hand easily insertable by hand, which however at the same time is secured against an unintentionally detaching.

In particular, the securing element may be integrally formed with the plug contact, i.e. the plug contact itself may be formed as securing feature, for example formed hook-shaped. Instead or in addition to barbs, the plug contact may also be formed as two parts, for example by two shanks or legs which comprise a certain elasticity, such that they are elastically pushed together when inserting the plug contact into a bore hole or a breakthrough of a circuit board, and push away from each other again after inserting, such that a certain clamping of the plug contacts in the breakthroughs (plug holes) of a circuit board is given.

According to an exemplary embodiment of the switch element, the switch element comprises a housing in which the switch element circuit is arranged and at which the plurality of plug contacts is arranged.

The housing thus may on the one hand serve as protection for the switch element circuit and on the other hand at the same time may be used as fastening possibility for the plug contacts, such that a compact architecture of the direct plug switch element may be enabled.

According to an exemplary embodiment of the switch element, the plurality of plug contacts is arranged in a pre-given arrangement pattern.

By the arrangement of the plurality of plug contacts in a pre-given arrangement pattern, it may be possible to prevent a faulty or twisted inserting of the switch element into a respective circuit board, if its inserting holes or boreholes are arranged in a corresponding arrangement pattern. In this way, it may be possible to increase the safety of the contacting and to exclude error possibilities.

According to an exemplary embodiment of the switch element, the housing comprises a housing part and an adapter part, wherein in the housing part the switch element circuit is arranged and wherein the plurality of plug contacts is fastened to the adapter part.

According to an exemplary embodiment of the switch element, the housing part and the adapter part are detachably connectable to each other.

Forming a separated adapter part which, for example, is connectable and/or detachable to the housing part by hand, it may be in particular enabled to flexibly and easily realize different switch element circuits which are adapted to the given necessities. Thus, for example it may be possible to differently use different switch element circuits by one and the same adapter part or the same switch element circuits with different adapter parts. For example, a multiplicity of different switch element circuits with different arrangements of contacting plugs of the switch element housing may be re-arranged to a unitary arrangement or a unitary arrangement pattern of plug contacts at the adapter part, which are inserted into the circuit board. In this sense, the adapter part may represent a re-contacting layer or a re-contacting element which acts similar to a re-wiring layer or redistribution layer (RDL) at packaged electronic circuits.

According to an exemplary embodiment of the switch element, the housing part comprises a plurality of contacting plugs which are adapted such that the housing part is connectable to the adapter part by them. In particular, the contacting plugs may be formed as flat plugs.

In particular, the contacting plugs may be formed tongue-shaped as flat plugs, and may correspond to a respective number of fork contacts which are formed in the adapter part. Thus it may be possible in an easy way to mechanically and/or electrically contact the housing part and the adapter part to each other. Such fork-tongue contacts may be an effective way to contact and to connect, respectively, two parts (housing part and adapter part) to each other by hand, wherein the connection on the one hand is detachable by hand, on the other hand enabling a sufficient stability or a sufficient resistance against an unintentionally detaching, for example by vibrations.

According to an exemplary embodiment of the switch element, the housing part and the adapter part are integrally formed. Thus, in particular the housing part and the adapter part may not be detachable, but only form sections of the entire housing.

In the following, embodiments of the adapter part are described, but these also apply for the switch element and the connection arrangement.

According to an exemplary embodiment of the adapter part, the fastening holes are arranged in a pre-given arrangement pattern which is corresponding to a pre-given arrangement pattern of contacting plugs of a housed switch element.

By providing a pre-given arrangement pattern or an arrangement of the fastening holes in the adapter part, it may be possible to prevent a twisted attaching or fastening of the housed switch element to the adapter part, such that the functional safety may be increased.

According to an exemplary embodiment of the adapter part, at least one of the plurality of fastening holes comprises a conductive portion which is electrically conductively connected to a corresponding one of the plurality of plug contacts.

In particular, multiple or all of the plurality of fastening holes may comprise a conductive portion, wherein each of the conductive portions is connected to a corresponding one of the plurality of plug contacts. The conductive portion may be formed at the inner sides of the fastening holes, such that an easy electrical contacting of the housed switch element with the adapter part is enabled.

Summarizing, a substantial idea for an exemplary embodiment may thus be seen in providing a direct plug switch element which can be directly inserted into a circuit board, such as a printed circuit board, which is used in an automobile, for example. Hereby, extensive soldering processes or welding processes are omitted. Preferably, the respective plug contacts of the direct plug switch element and correspondingly the plug holes of the circuit board comprise an arrangement pattern which prevents an unintentionally twisted inserting of the switch element into the circuit board. Additionally, the plug contacts comprise a securing feature, i.e. an element like a barb which prevents an unintentionally detaching, for example by vibrations, or at least reduces the risk of the occurrence of such a detaching. The direct plug switch element is preferably housed, wherein the housing may be formed integrally or alternatively comprises a housing part and an adapter part which are connectable to each other.

DETAILED DESCRIPTION OF EXEMPLARY EMBODIMENTS

Figure 2:
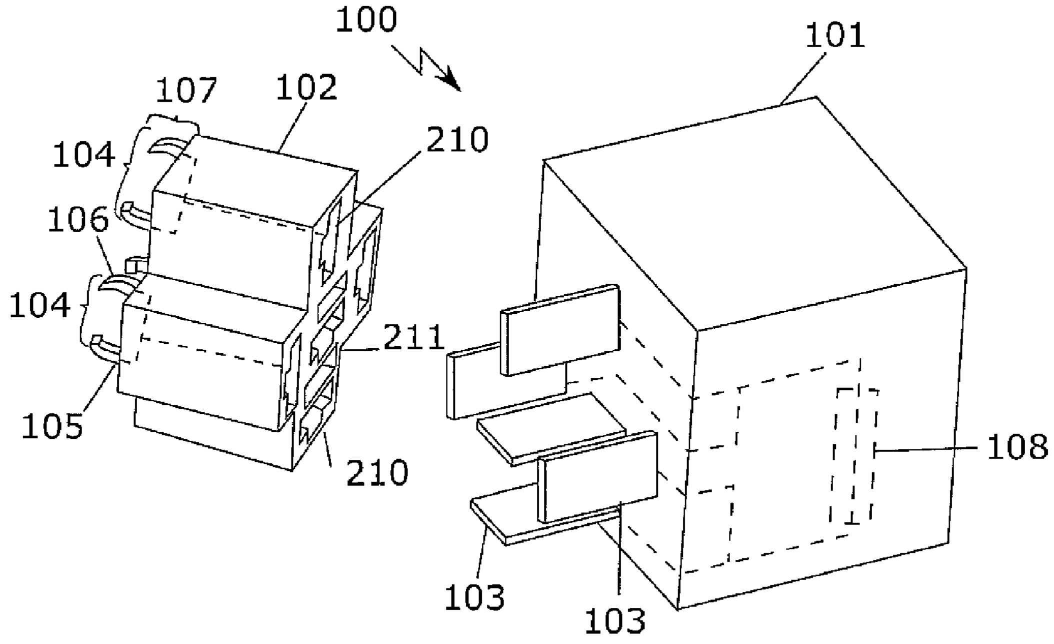
Figure 3:
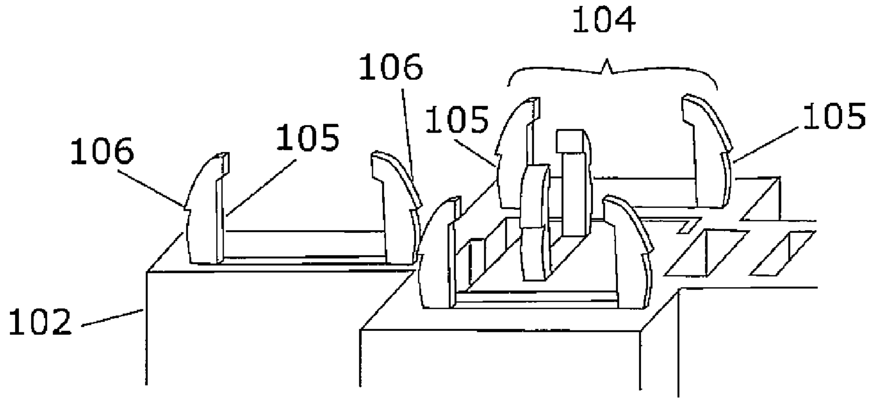
Figure 4:
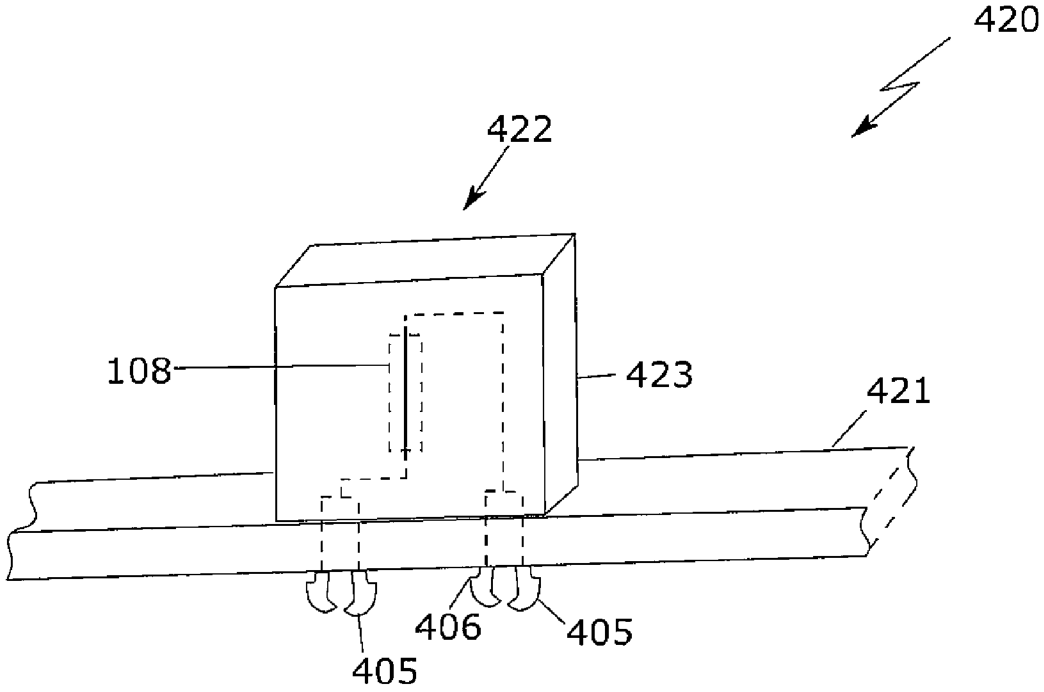

In the following, for further explanation and for a better understanding of the present invention, embodiments are described in more detail with reference to the accompanying drawings. It is shown by:

FIG. 1 a spatial view of a direct plug switch element according to an exemplary embodiment;

FIG. 2 an exploded view of the direct plug switch element of FIG. 1;

FIG. 3 a plug contact of a direct plug switch element in an enlarged view; and FIG. 4 a schematic view of a connection arrangement.

Same or similar components in different figures are provided with the same reference numbers.

FIG. 1 shows a spatial view of a direct plug switch element 100. In particular, FIG. 1 shows a housing part 101 and an adapter part 102 which, in FIG. 1, are plugged together and contacted, respectively. In the housing part 101, a switch element circuit, for example a relay or a fuse (schematically shown in FIG. 1 with reference sign 108), is arranged, which is contacted via contacting plugs 103 with the adapter part 102. In the embodiment of FIG. 1, the contacting plugs are formed as flat plugs which are in contact and in connection, respectively, with contact holes (cf. FIG. 2) of the adapter part 102. However, also other suitable shapes of contacting plugs, such as spring-like formed plugs or banana plugs, are possible.

The adapter part 102 on a first side comprises the contact holes and on another side which, in the embodiment of FIG. 2, is opposite to the first side, comprises plug contacts 104 which comprise a fastening portion 107 and a connection portion which is not visible in FIG. 1, since it is arranged within the adapter part 102. However, in other embodiments, the plug contacts may also be formed or arranged on lateral surfaces or sides of the adapter part. In the embodiment of FIG. 1, each plug contact comprises two legs or shanks 105 which together form a single plug contact and can be commonly inserted into a plug hole of a circuit board, for example a printed circuit board. By inserting two shanks in one single plug hole, a relatively fix fastening of the adapter part and thus of the direct plug switch element to the circuit board can be achieved, when the single shanks comprise a certain elasticity and are pushed together during inserting into plug holes of the circuit board and, after inserting, move a little back outwardly again.

Preferably, all or at least one of the plug contacts comprise a securing feature by which an additional securing of the adapter part 102 and thus of the entire direct plug switch element 100 to the circuit board is enabled. In the embodiment of FIG. 1, this securing feature, for example, is providing a barb 106 at an end of the plug contact 104, which is inserted into the circuit board. These barbs 106, after inserting into a circuit board, engage behind it and hence result in that an unintentionally detaching, for example by vibrations, is made impossible or is at least impeded. Hereby, the functional safety can be increased, since the connection with the circuit board is reinforced and made more secured against failure.

FIG. 2 shows an exploded view of the direct plug switch element of FIG. 1, which, for example, forms a direct plug relay or a direct plug fuse. In particular, FIG. 2 shows the housing part 101 and the adapter part 102 in a position separated from each other, such that on the one hand the contacting plugs 103 and contact holes 210 corresponding thereto in the adapter part are better visible. Corresponding to the flat plug-like shape of the contacting plugs 103, the contact holes 210 comprise fork-shaped formed contact tongues 211 between which the flat plug-like contacting plugs 103 of the housing part 101 are clamped. The contact tongues 211 at the same time, in the case that they are made of electrically conductive material, provide a through-contacting of the contacting plugs which are connected to the switch element circuit of the housing part and the plug contacts 104 of the adapter part, such that the switch element circuit is electrically connected to the circuit board when inserting the plug contacts 104 into a circuit board. Further, it can be seen in FIG. 2 that the contacting plugs 103 of the housing part 101 comprise a pre-given arrangement or a pre-given arrangement pattern which corresponds to an arrangement of the contact holes 210 in the adapter part.

It should be noted that not all contact holes 210 have to be equipped with electrically conductive tongues 211. By a specific selection, which of the contact holes 211 are provided with conductive contacts/tongues, a specific selection is possible, how the respective switch element circuit shall be electrically contacted. In particular, the adapter part 102 may also be formed or regarded as a kind of re-wiring part or re-contacting part at which the arrangement of the terminals between an assignment at the switch element housing itself and the insertion point of the adapter part into the circuit board can be adapted according to the desires or necessities.

FIG. 3 shows a plug contact 104 of the direct plug switch element 100 in an enlarged view. In particular, the both shanks 105 of the plug contact and the end of the plug contact formed as barb 106 can be seen here. Further, it can be seen in FIG. 3 that a tip of the plug contact 104 is formed rounded, whereby it is possible that an inserting or the plug contact 104 into the circuit board is simplified.

FIG. 4 is a schematic view of a connection arrangement 420. In particular, FIG. 4 shows a circuit board 421 in which a direct plug switch element, for example a direct plug relay or a direct plug fuse 422 is inserted. In contrast to the embodiments of FIG. 1 to FIG. 3, the direct plug switch element 422 comprises an integral housing 423, i.e. no adapter part which is separable from a housing part is provided. Plug contacts 405 are formed directly at the housing 423, which engage behind the circuit board 421 by barbs 406, such that a fix fastening of the direct plug switch element is enabled, which withstands vibrations, for example.

It should be noted that, additionally or alternatively to the barbs at the plug contacts, which also serve for an electrical contacting, also plug contacts or screw contacts as securing features can be provided, which do not provide an electrical contacting, but only serve for a mechanical securing. In this case, also electrically contacting plug contacts are provided.

Complementary, it should be noted that "including" does not exclude other elements or steps and "a" or "an" does not exclude a multiplicity. Further, it should be noted that features or steps which are described with reference to one of the above embodiments, can also be used in combination with other features or steps of other embodiments described above. Reference signs in the claims shall not be considered as limitation.

The invention claimed is:

1. A switch element for directly inserting into a circuit board, wherein the switch element comprises:
- a switch element circuit for switching a current; and
- a plurality of plug contacts, wherein the plug contacts comprise a connection portion, which is connected to the switch element circuit, and a fastening portion,
- wherein the fastening portion is adapted such that it is directly insertable into the circuit board, and
- wherein the fastening portion comprises a securing element which is adapted such that an unintentionally detaching of a plug connection between the fastening portion and the circuit board is prevented;
- wherein the switch element comprises a housing in which the switch element circuit is arranged;
- wherein the housing comprises a housing part and an adapter part,
- wherein the switch element circuit is arranged in the housing part and wherein the plurality of plug contacts is fastened to the adapter part.

2. The switch element according to claim 1, wherein the plug contacts are adapted such that they are insertable into the circuit board by hand.

3. The switch element according to claim 1, wherein insertion of the fastening portion of the plug contacts is robust against vibration.

4. The switch element according to claim 1, wherein the securing element is a mechanical securing element.

5. The switch element according to claim 1, wherein the plurality of plug contacts is arranged in a preset arrangement pattern.

6. The switch element according to claim 1, wherein the housing part and the adapter part are detachably connectable to each other.

7. The switch element according to claim 1, wherein the housing part comprises a plurality of contacting plugs which are adapted such that the housing part is connectable to the adapter part by the contacting plugs.

8. A connection arrangement which comprises:
- a switch element according to claim 1; and
- a circuit board with a plurality of plug holes,
- wherein the switch element with the plurality of plug contacts is inserted into the plurality of plug holes.

9. An adapter part for a housed switch element, wherein the adapter part comprises:
- a corpus with two surfaces;
- a plurality of plug contacts; and
- a plurality of fastening holes which are adapted for receipt of contacting plugs electrically connected to a switch element circuit of the housed switch element,
- wherein the plurality of plug contacts are formed at one of the two surfaces and wherein the plurality of fastening holes are formed at the other of the two surfaces.

10. The adapter part according to claim 9, wherein the fastening holes are arranged in a preset arrangement pattern which is corresponding to a preset arrangement pattern of contacting plugs of a housed switch element.

11. The adapter part according to claim 9, wherein at least one of the plurality of fastening holes comprises a conductive portion which is electrically conductively connected to one of the plurality of plug contacts.

12. A method for directly inserting a housed switch element into plug holes of a circuit board, wherein the method comprises:
- providing a circuit board with a plurality of plug holes; and directly inserting a housed switch element having a switch element circuit and a plurality of plug contacts, wherein each of the plurality of plug contacts is inserted into a corresponding plug hole of the circuit board;

wherein the switch element comprises a housing in which the switch element circuit is arranged;

wherein the housing comprises a housing part and an adapter part, wherein the switch element circuit is arranged in the housing part and wherein the plurality of plug contacts is fastened to the adapter part.

* * * * *